United States Patent [19]

Reed

[11] 4,205,227
[45] May 27, 1980

[54] SINGLE JUNCTION EMITTER ARRAY

[75] Inventor: Bruce S. Reed, Dallas, Tex.

[73] Assignee: Texas Instruments Incorporated, Dallas, Tex.

[21] Appl. No.: 871,657

[22] Filed: Jan. 23, 1978

Related U.S. Application Data

[63] Continuation-in-part of Ser. No. 745,153, Nov. 26, 1976, abandoned.

[51] Int. Cl.² .............................................. H01J 31/50
[52] U.S. Cl. .................................... 250/330; 250/338; 357/30
[58] Field of Search ............... 250/370, 332, 334, 338, 250/330; 357/17, 19, 55, 30, 20

[56] References Cited

U.S. PATENT DOCUMENTS

| | | | |
|---|---|---|---|
| 3,293,513 | 12/1966 | Biard et al. | 357/17 |
| 3,388,255 | 6/1968 | May | 357/19 |
| 3,636,618 | 1/1972 | Herzog et al. | 357/17 |
| 3,846,193 | 11/1974 | Jacobus et al. | 357/17 |

Primary Examiner—Alfred E. Smith
Assistant Examiner—Carolyn E. Fields
Attorney, Agent, or Firm—Rene' Grossman; James T. Comfort; Alva H. Bandy

[57] ABSTRACT

An apparatus for translating information in one form to electrical signals for driving a single junction emitter light source is disclosed. For example, a device for scanning radiant energy includes a detector array for converting detected invisible electromagnetic energy emanating from a body into electrical signals representative thereof, an electrical signal processing means coupled to the detector array for processing the electrical signals thereof for display, and a single junction emitter array for producing visible light indicative of the invisible electromagnetic energy emanating from the detected body. The single junction emitter array comprises a substrate of light emitting semiconductor material forming a region of n-type conductivity, a region of p-type conductivity formed in the substrate to form with the n-type conductivity region a continuous p-n junction, a plurality of spaced contacts in contact with the p-type conductivity region, and a corresponding plurality of biasing circuits connected to the contacts. The biased contacts coact with the continuous p-n junction to form a plurality of light emitter elements for producing, without scan lines, visible light indicative of the visible electromagnetic energy emanating from the body.

3 Claims, 14 Drawing Figures

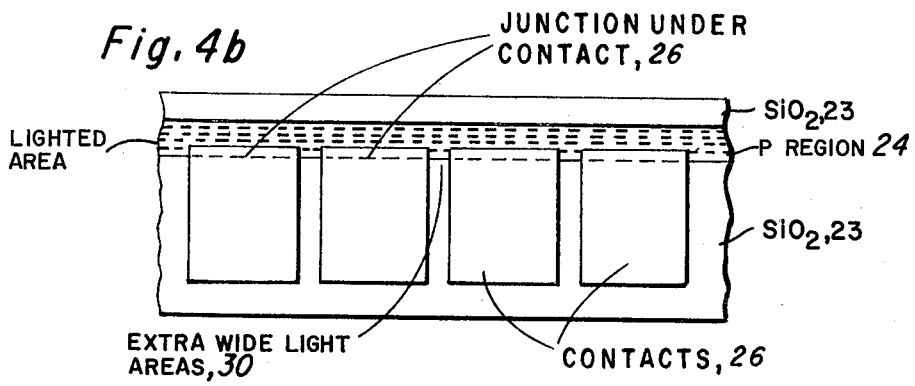
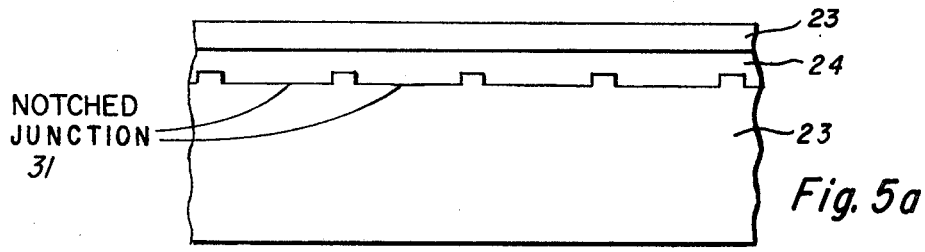
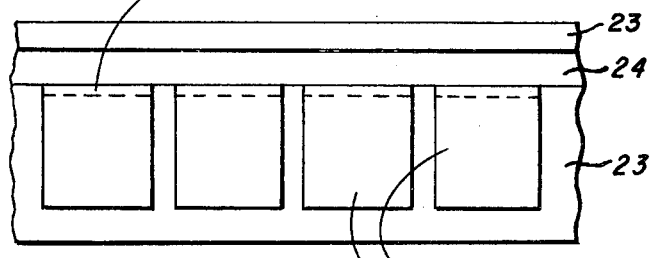
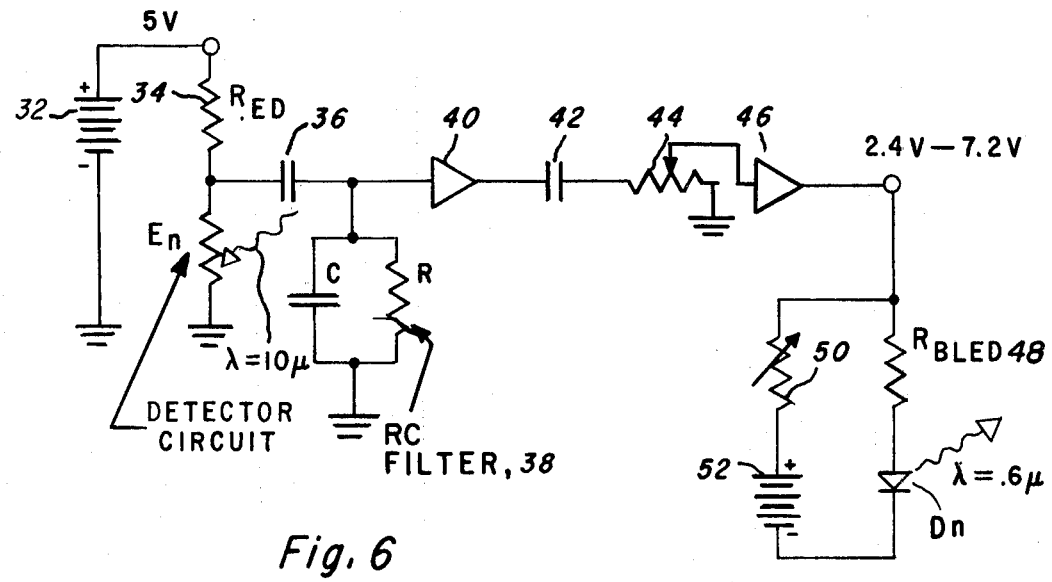

SINGLE JUNCTION EMITTER ARRAY

This is a continuation in part of application Ser. No. 745,153 filed Nov. 26, 1976, now abandoned.

This invention relates to opto-electronic devices, and more particularly to apparatuses translating information into electrical signals and using the electrical signals to provide visible light representations of the information.

In the past such apparatuses have included infrared detector systems, such as the system disclosed in U.S. Pat. No. 3,912,927 issued Oct. 14, 1975. This system included an infrared scanner which includes a mirror as the scanning element. The front and rear surfaces of the mirror scan, respectively, the infrared energy and visible energy. The mirror is mounted in a two axes gimbal and oscillated therein to produce a raster scan. It is rotated clockwise about a vertical axis to produce a horizontal scan path from a first point to a second point, then rotated about a horizontal axis disposed either 90° or less to the vertical axis to produce a predetermined vertical movement, and rotated counter-clockwise from the second point to the first point to produce a return horizontal scan about the vertical axis. The scan mirror thus reflects infrared energy to a detector array which produces electrical signals representative of the infrared energy received. The output of the detector array is fed to video electronic circuitry for amplification for a light source. Prior art light sources have included a plurality of spaced light emitting diodes forming a linear array of discrete light emitting diodes. Each diode element comprises a small independent p-n junction in semiconductor material and emits light independently of the others. Each diode may represent one scan line of a raster generated picture representative of the detected infrared energy emanating from the scene scanned by the scanning mirror. This prior art light source is known to those skilled in the art as a discrete array light source.

A disadvantage arising from use of the discrete array of light emitting diodes is the dark scan lines produced by the gap or space between the individual or discrete diodes. The scan lines are particularly objectionable in a smooth scene; they exist even when the separation between discrete diodes is reduced to $5 \times 10^{-4}$ inches. The interlacing of odd numbered scan lines with the even numbered scan lines has reduced the intensity of the dark scan lines; nevertheless, the objectionable scan lines are still visible in the visible representation of the scene.

Accordingly, it is an object of this invention to provide an apparatus for scanning radiant energy and displaying a visible representation thereof without visible scan lines.

Another object of this invention is to provide an improved light emitter array for forward looking infrared systems, infrared mapper systems, printout type computers, and photocopiers.

A further object of the invention is to provide an improved emitter array which is economical to fabricate, highly reliable, and amenable to mass production techniques.

Briefly stated the invention comprises an electro-optical device having an information translation system, a video electronics circuit, and a single junction light emitter array. The information translation system converts information such as, for example, an infrared or visible scene, computer programmed information or printed material signals for the video electronics circuitry to electrical signals. The video electronics circuitry processes the electrical signals into video signals for the single junction light emitter array which produces a visible display representative of the information.

The novel features believed to be characteristic of this invention are set forth in the appended claims. The invention itself, however, as well as other objects and advantages thereof may best be understood by references to the following detailed description of illustrative embodiments when read in conjunction with the accompanying drawings in which:

FIG. 2b is a cross-sectional view taken along line A—A of FIG. 2a;

FIG. 2c is a cross-sectional view taken along line B—B of FIG. 2a;

FIG. 3b is a graphical representation of the light output of the device of FIG. 3a;

FIG. 3c is a plan view of the device of FIG. 3a;

FIG. 3d is a partial equivalent circuit of the device of FIG. 3a;

FIGS. 4a and 4b are, respectively, plan views of the embodiment of the invention shown in FIGS. 2a, 2b, and 2c without and with contacts;

FIGS. 5a and 5b are, respectively, plan views of a modification of the embodiment of the invention of FIGS. 2a, 2b, and 2c without and with contacts;

FIG. 6 is a schematic diagram of a circuit for each Forward Looking Infrared (FLIR) channel.

Although the information transducer system may be that for a computer, photocopier, or infrared scanner for purposes of description a Forward Looking Infrared System is used.

Figure 1A:
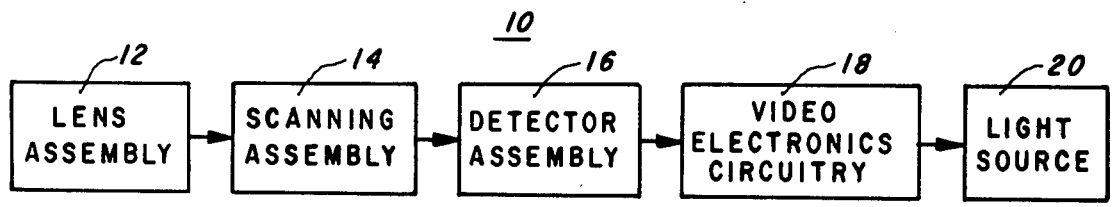
FIG. 1a is a block diagram of a Forward Looking Infrared (FLIR) system.

Referring to the drawings, the forward looking infrared (FLIR) system 10 embodiment of the invention (FIG. 1a) comprises a lens assembly 12, scanning assembly 14, detector assembly 16, video electronic circuitry 18, and a light source 20. It will be appreciated by those skilled in the art that if the FLIR system is a staring system, the scanning assembly 14 is omitted. The lens assembly 12 is comprised of three lens elements, not shown, which for operation in the infrared region, may consist of three germanium elements. These elements collect infrared energy emanating from a scene and focus this energy onto a rotating mirror, not shown, of the scanning assembly 14. The rotating mirror may be, for example, a two sided flat mirror. The first side or front surface, of the mirror is used to receive the infrared energy, and the second side, or rear surface, of the mirror is used to scan the modulated visible light from the light source 20 to be described hereafter in greater detail. The scanning mirror is positioned with its "Y" axis normal to the optical axis and its "X" axis at a 45° angle thereto. In this position the scanning mirror reflects the infrared energy to a folding mirror, not shown, for reflection onto the detector or detector array of the detector assembly 16. The detector assembly 16 is, for example, an array of linearly disposed mercury cadmium telluride (HgCdTe) diodes, or indium antimonide (InSb) detectors. The detector array is a transducer which converts the infrared energy to electrical signals for processing in the video electronics circuitry 18. The video electronics circuitry connects each detector of the array of detectors to a corresponding light emitting diode, not shown, of the light source 20, and provides the signal processing auxiliary functions to modulate the output of each light emitting diode. Finally the visible light from the light source is directed to impinge upon a folding mirror, not shown, and the folding mirror reflects the visible light through a collimating lens to the second side, or back surface, of the scanning mirror for viewing by an observer.

The particular designs of the lens assembly 12, scanning assembly 14, detector assembly 16, or video electronics circuitry 18 are no part of the present invention and are well known prior art structures. Those desiring details of suitable structures for these elements are referred to U.S. Pat. No. 3,912,927 issued Oct. 14, 1975, to Richard G. Hoffman, II, for an "OPTO-MECHANICAL DEVICE FOR PHASE SHIFT COMPENSATION OF OSCILLATING MIRROR SCANNERS".

Figure 1B:
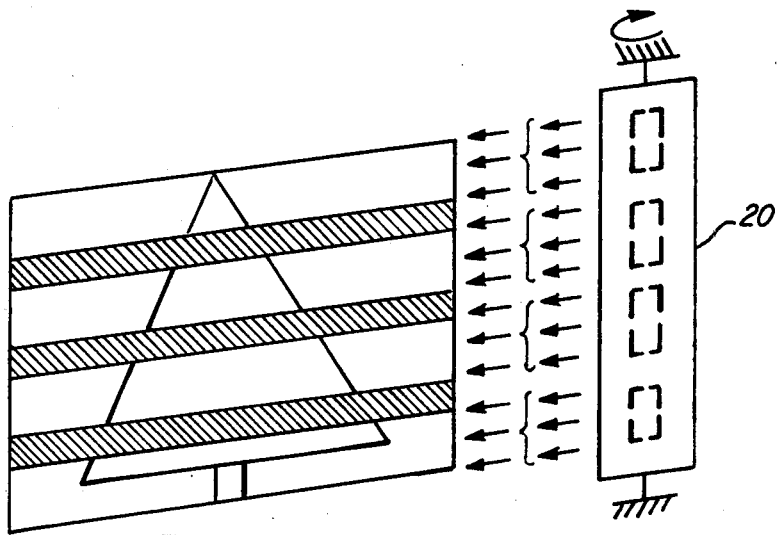
FIG. 1b is a view showing the display produced by a prior art light source.

As previously mentioned, a staring forward looking infrared energy (FLIR) system can be used without the scanning assembly 14, when a different detector assembly is used. For example, the detector assembly might include a detector array of ferromagnetic capacitors arranged in rows and columns. The lens assembly focuses the infrared energy representative of the scene onto the detector array. The output of the detector array is processed in the video electronic circuitry 18 and the video signals connected to the light source 20 for display. A suitable detector assembly 16 for a staring system is that shown in U.S. Pat. No. 4,080,532, application Ser. No. 796,785 filed May 13, 1977 by George S. Hopper for "FERROELECTRIC IMAGING SYSTEM". However, the light source is objectionable in that it contains dark scan lines (FIG. 1b) produced by the gaps between the light emitting diodes of the array of discrete diodes. These dark scan lines, which are the cross-hatched lines on the Christmas tree scene, are substantially eliminated by the single junction array of light emitting diodes of the present light source 20.

Figure 2A:
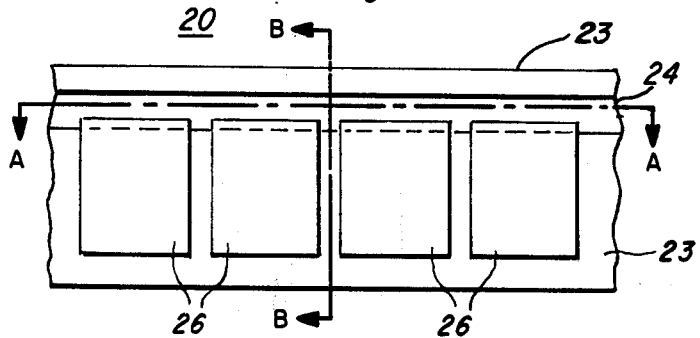
FIG. 2a is a top view of an embodiment of the invention.
Figure 2B:
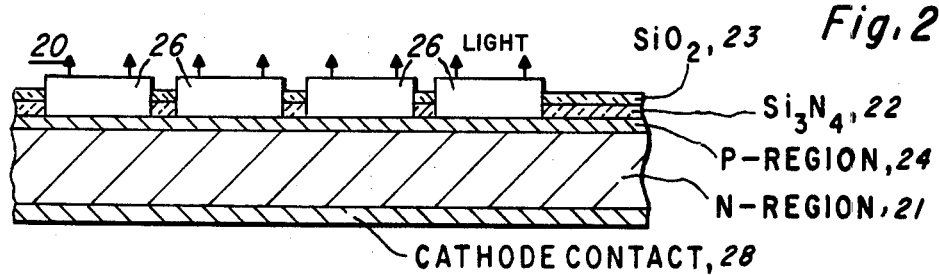
Figure 2C:
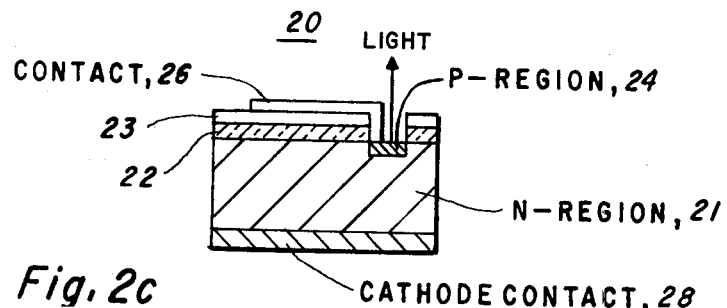

Referring now to FIGS. 2a, 2b, and 2c, the light source 20 of the invention comprises a single junction light emitter array formed on a semiconductor chip. The semiconductor material for the single junction light emitter array must produce a substantial number of photons rather than heat when electrons injected at the cathode 28 (FIG. 2b) cross the p-n junction as free electrons to combine with holes created by the withdrawal of bound electrons at the anode contacts 26. A suitable semiconductor material is, for example, gallium arsenide, gallium arsenide phosphide, gallium phosphide, gallium nitride, or silicon carbide. For purposes of describing the invention, gallium arsenide phosphide will be used. The single junction light emitter array is formed using well known techniques as follows:

A chip 21 (FIGS. 2b and 2c) of gallium arsenide phosphide having an n-type conductivity is coated with a layer of silicon nitride 22 using any of the well known deposition techniques. The n-type conductivity is obtained, for example, by doping the gallium arsenide phosphide with tellurium. The silicon nitride layer 22 is followed by a deposited layer of silicon oxide 23. The layered chip is masked with a suitable mask and a strip of the silicon oxide and silicon nitride selectively etched away using suitable etchants such as, for example, a buffered solution of hydrofluoric acid for the silicon oxide layer and a freon plasma for the silicon nitride layer to form the strip pattern for the p-type conductivity region 24. Next, excess zinc, for example, is diffused into this surface, hereinafter referred to as the upper surface, of the gallium arsenide substrate to form a p-type region 24 (FIGS. 2a, 2b, and 2c). Then, a plurality of spaced ohmic contacts are formed over the p-n junction in contact with the p-type region to provide the plurality of anode contacts 26, and finally, a common ohmic contact 28 (FIGS. 2b and 2c) is formed on a surface, hereinafter referred to as the lower surface, opposite the upper surface of the substrate. The contacts 26 and 28 may be formed from any suitable conductive material such as gold or aluminum.

Figure 3A:
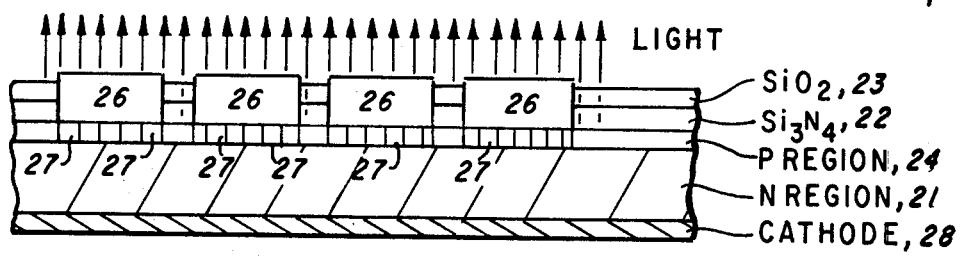
FIG. 3a is the cross-sectional view of FIG. 2b showing the direction of the light output.

Referring now to FIG. 3a, the p-n junction being a single junction, it is a distributed junction; that is, it consists of an infinite number of diodes which are capable of producing light in response to the flow of current therethrough. The number of diodes 27 directly under the contacts 26 are activated by the current flow produced by the bias voltage, which is, for example, 1.6 v in a GaAsP device. The diodes between the contacts are activated by the fan out flow of current at a reduced potential. The potential voltage between the anode contacts 26 is reduced by the resistance of the semiconductor material and the "pinch off" diode effect. The arrows (FIG. 3a) indicate the flow of light from the single junction light emitting diode in response to the flow of current across the p-n junction when all the anode contacts 26 are biased on. Although light is produced in all directions the semiconductor material absorbs the light; therefore, substantially no light is emitted except as indicated.

Figure 3B:
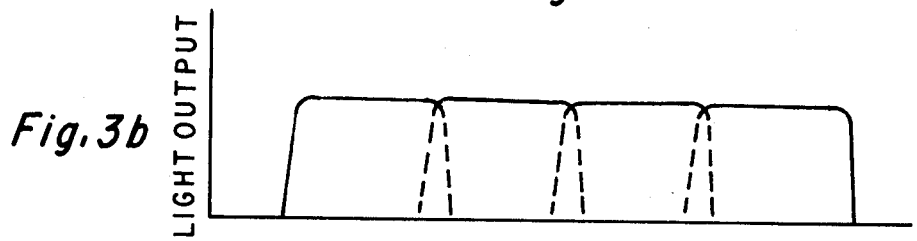

Referring now to FIG. 3b, which shows graphically the light output of the single junction light emitting diode, by properly spacing the diodes 26 the light produced by current fan out is used to eliminate the dark scan lines (FIG. 1b) and the diode "pinch off" effect limits substantially the "crosstalk" between adjacent diodes formed by anode contacts 26. Without "pinch off" the current ratio $I_1/I_2$ between diodes D-1 and D-2 would be 1, but with "pinch off" the ratio $I_1/I_2$ is about 14.

Diode "pinch off" is explained using the ideal p-n junction diode DC equation and Kirchoff's law of voltages. For purposes of the explanation only one diode D-1 (FIG. 3c) is biased on. The ideal p-n junction diode DC equation (also called d-c rectifier equation) is developed in Rajindra P. Nanavate's textbook "An Introduction to Semiconductor Electronics" published 1963 by McGraw-Hall Book Company, Inc. (pages 103-105) and is $$I = I_o(e^{qv/kT} - 1)$$

where
  T = absolute temperature
  k = Boltzmann constant
  q = electron charge
  v = voltage
  $I_o$ = constant dependent on material and size (for GaAsP junction of $1.5 \times 3.5$ mils $I_o = 1.88 \times 10^{-29}$)

Kirchoff's law of voltages is "The algebraic sum of the voltage drops in any closed path in a circuit is equal to the algebraic sum of the electromotive forces in that path."

Figure 3C:
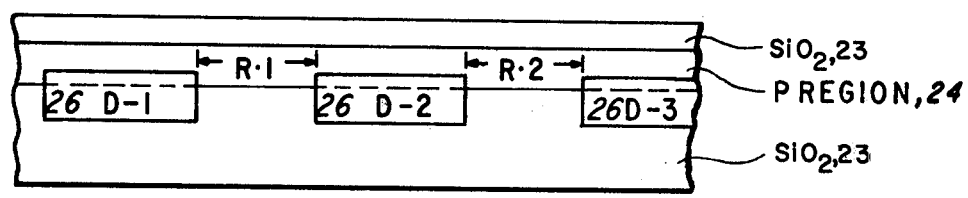

As shown in FIG. 3c (which is greatly exaggerated) the contacts 26 define diodes D-1, D-2, and D-3 along the continuous p-n junction and the semiconductor material between the contacts form the resistors R-1 and R-2. The values of resistors R-1 and R-2 is determined by the formula $R=\rho L/A$, where R, L, and A are resistance, length, and cross-sectional area, respectively, and $\rho$ is the resistivity or specific resistance of the material.

Figure 3D:
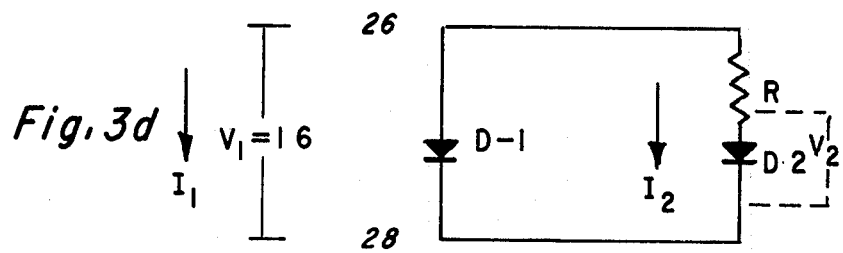

The equivalent circuit is shown partially in FIG. 3d and includes cathode 28 connected to the cathodes of the diodes D-1 and D-2. The anode 26 of diode D-1 is connected to the anode or 1.6 v bias voltage and to one end of the resistor R. The other end of resistor R is connected to the anode of diode D-2.

The current flow through diode D-1 is computed from the dc rectifier equation as follows:

$$I=I_o(e^{qv/kT}-1)=I_o(e^{v/kT/q}-1);$$

at room temperature;

$$I=I_o(e^{v/0.026}-1);$$

substituting $v=1.6$ $$I_1=I_o(e^{1.6/0.026}-1)=I_o(e^{61}-1)=I_o(2.718^{61}-1)=I_o(5.318\times10^{26}) \text{ (the one is dropped as being insignificant)};$$

substituting $I_o=1.88\times10^{-29}$ $$I_1=(1.88\times10^{-29})(5.318\times10^{26})=0.01 \text{ amps.}$$

To solve for current in diode D-2 Kirchoff's law is used as follows:

$$(R_1)(I_2)+V_2=V_1;$$

substituting $I_2=I_o(e^{qv2/kT}-1)$ $$(R_1)[I_o(e^{qv2/kT}-1)]+V_2=V_1=1.6; \text{ or}$$

$$(R_1)I_o(e^{V2/0.026}-1)+V_2=1.6;$$

solving for $V_2$ by numerical techniques, for $R=100$ ohms;

$$(100)(1.88\times10^{-29})(e^{V2/0.026}-1)+V_2=1.6$$

$$V_2\approx1.531 \text{ volts}$$

$$I_2=1.88\times10^{-29}(e^{1.531/0.026}-1)$$

$$I_2=0.0007 \text{ amps.}$$

check;

$$R_1\times I_2+V_2=1.6$$

$$(100)(0.0007)+1.531=1.601 \text{ v}$$

$$I_1/I_2=0.01/0.0007$$

Thus, the current (0.01/0.0007 amp) $I_1/I_2$ ratio (about 14) demonstrates the current "pinch off" diode effect and as the light flow is proportional to the current, crosstalk is substantially reduced.

Figure 4A:
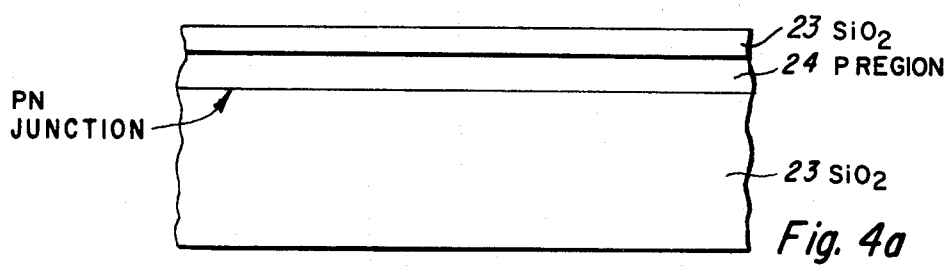

With the p-type conductivity stripe or region 24 of FIGS. 2b and 2c rectangularly shaped as shown in FIG. 4a and covered with the contacts 26 as shown in FIG. 4b, the light output at the upper surface or top (shaded area of FIG. 4b) appears extra wide between the contacts 26. To eliminate the wide areas 30 and provide uniform width, the p-type conductivity stripe can be diffused into the n-type substrate through a mask patterned to provide a notched junction 31 on one side (FIG. 5a). The contact leads 26 are then attached to the protruding areas between notches as shown in FIG. 5b. When the contacts 26 are aligned with the diffusion area between notches as shown, the wide areas 30 (FIG. 4b) of extra light are eliminated. The wide areas (30) can also be masked out by using a suitable masking material such as amorphous silicon.

Referring to FIG. 6, each FLIR channel comprises an infrared energy detector element $E_n$ and a corresponding light emitting element $D_n$ connected in an electrical circuit as follows. A source of power 32 such as, for example, a battery is coupled through a voltage divider resistor 34 to the junction of detector element $E_n$ and capacitor 36. The detector element $E_n$ acts as the other voltage divider resistor whose resistance varies in proportion to the intensity of infrared energy impinging thereon. The charge of capacitor 36 varies in accordance with the voltage divider output. The capacitor 36 is coupled to the junction of an RC filter 38 and preamplifier 40. The filter 38 bypasses unwanted high signal frequencies and d.c. to ground and the preamplifier 40 amplifies the desired frequencies to a working level. The preamplifier 40 is coupled through a capacitor 42 and potentiometer 44 to a three stage post amplifier 46. The output of the post amplifier is preferably between about 2.4 volts and 7.2 volts and is coupled to the junction of a biasing circuit and a bleeder resistor 48. The bleeder resistor 48 is connected to the anode of the light emitter element $D_n$. The biasing circuit includes a variable resistor 50 connected to the positive terminal of a second source of power 52. The second source of power 52 has its negative terminal connected to the cathode of element $D_n$. Thus, the biasing circuit provides a selected constant voltage to the post amplifier voltage and the combined voltage is applied to the bleeder resistor 48 which limits the varying positive voltages applied to the anode of light emitter element $D_n$.

In operation each detector element $E_n$ provides an electrical signal presentative of the infrared energy of a scene impinging thereon. The signal is amplified and applied to the light emitter element $D_n$ biasing voltage to vary the current to be applied to the anode of the emitter element $D_n$. The cathode of the emitter element is connected to the negative terminal of the source of power. As a result electrons injected into the substrate 21 (FIG. 2b) at the cathode 28 cross the N region as free electrons, while holes, created at the anode contacts 26 by the withdrawal of bound electrons, cross the p regions. Near the p-n junction, free electrons fall into holes generating photons of light. The forward light varies in proportion to the voltage of the infrared detector signals. The light from the single junction light emitter array is then scanned to produce a visible display of the scene.

Although a single embodiment of this invention with various modifications has been described herein, it will be appreciated by those skilled in the art that other modifications to the details of construction shown and described may be made without departing from the scope of this invention.

What is claimed is:

1. A light emitter array comprising:

(a) a substrate of a first type conductivity semiconductor material having opposing first and second major surfaces, said substrate forming a region of said first type conductivity;

(b) a layer of insulating material selectively covering the first major surface of the substrate;

(c) an elongated region of a second-type conductivity semiconductor material formed in the first major surface of the substrate of the first type conductivity semiconductor material said region being defined by the layer of insulating material, said regions of first and second type conductivities semiconductor materials forming a continuous elongated p-n junction;

(d) a plurality of selectively spaced contacts; said plurality of contacts being mounted on the layer of insulating material selectively covering the first major surface of the substrate and having portions thereof in spaced electrical contact with the region of second type semiconductor material and at least one contact in electrical contact with the second major surface of the substrate to form a plurality of substantially independent light emitting areas along the p-n junctions; and (e) biasing means connected to the plurality of contacts for biasing the junction formed by the first and second type conductivities semiconductor material to produce an array of adjacent light emitting areas for producing a display of a scene free of scan lines.

2. In an infrared detection system, a light emitter array comprising:

(a) a substrate of n-type conductivity semiconductor material having opposing first and second major surfaces;

(b) a surface passivation layer and an oxide mask layer, said layers selectively covering portions of the first major surface of the substrate to form an uncovered portion;

(c) a diffused stripe of a p-type conductivity material diffused in the uncovered portion of the first major portion of the substrate to form an elongated p-n junction; and (d) a plurality of selectively spaced contacts formed on the oxide mask layer and in contact with the diffused stripe of p-type semiconductor material, and at least one contact in electrical contact with the second major surface of the substrate said contacts for connection to a source of power for providing from a single p-n junction an array of light emitting diodes whereby each diode is responsive substantially independent of adjacent diodes.

3. A light emitter array comprising:

(a) a substrate of a first-type conductivity semiconductor material forming a region of said first type conductivity;

(b) a region of a second-type conductivity semiconductor material formed in the substrate of the first-type conductivity semiconductor material, said regions of first and second type conductivity semiconductor materials forming a continuous elongated p-n junction, wherein the region of second type conductivity semiconductor material has a notched edge configuration with the first type conductivity semiconductor material filling the notches, said notches constituting the spacing between the plurality of spaced contacts which coact with the contacts to provide a light emitting area of uniform thickness;

(c) a plurality of contacts, said plurality of contacts having portions thereof in spaced electrical contact with the region of second-type semiconductor material to form a plurality of substantially independent light emitting areas on the p-n junction; and (d) biasing means connected to said plurality contacts for biasing the junction formed by the first and second type conductivity semiconductor material to produce an array of adjacent light emitting areas for producing a display free of scan lines.

* * * * *